(12) United States Patent
Cai et al.

(10) Patent No.: US 9,231,051 B2
(45) Date of Patent: Jan. 5, 2016

(54) METHODS OF FORMING SPACERS ON FINFETS AND OTHER SEMICONDUCTOR DEVICES

(71) Applicant: GLOBALFOUNDRIES Inc., Grand Cayman (KY)

(72) Inventors: Xiuyu Cai, Albany, NY (US); Ruilong Xie, Albany, NY (US); William J. Taylor, Jr., Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/579,428

(22) Filed: Dec. 22, 2014

(65) Prior Publication Data

US 2015/0145071 A1  May 28, 2015

Related U.S. Application Data

(62) Division of application No. 14/524,076, filed on Oct. 27, 2014, now Pat. No. 8,962,413, which is a division of application No. 13/462,185, filed on May 2, 2012, now Pat. No. 8,900,941.

(51) Int. Cl.
| | |
|---|---|
| *H01L 21/8234* | (2006.01) |
| *H01L 29/06* | (2006.01) |
| *H01L 29/66* | (2006.01) |
| *H01L 29/78* | (2006.01) |
| *H01L 21/02* | (2006.01) |
| *H01L 21/762* | (2006.01) |
| *H01L 27/088* | (2006.01) |

(52) U.S. Cl.
CPC ...... *H01L 29/0649* (2013.01); *H01L 21/02263* (2013.01); *H01L 21/76224* (2013.01); *H01L 21/823431* (2013.01); *H01L 21/823481* (2013.01); *H01L 27/0886* (2013.01); *H01L 29/66795* (2013.01); *H01L 29/7851* (2013.01)

(58) Field of Classification Search
CPC ............... H01L 21/02436; H01L 21/02518; H01L 21/8232; H01L 29/66409
See application file for complete search history.

(56) References Cited

U.S. PATENT DOCUMENTS

| | | |
|---|---|---|
| 7,915,139 B1 | 3/2011 | Lang et al. |
| 2005/0019993 A1 | 1/2005 | Lee et al. |
| 2005/0190605 A1* | 9/2005 | Miida ...................... 365/185.24 |

* cited by examiner

*Primary Examiner* — Cheung Lee
(74) *Attorney, Agent, or Firm* — Amerson Law Firm, PLLC

(57) ABSTRACT

Disclosed herein are various methods of forming spacers on FinFETs and other semiconductor devices. In one example, the method includes forming a plurality of spaced-apart trenches in a semiconducting substrate that defines a fin, forming a first layer of insulating material in the trenches that covers a lower portion of the fin but exposes an upper portion of the fin, and forming a second layer of insulating material on the exposed upper portion of the fin. The method further comprises selectively forming a dielectric material above an upper surface of the fin and in a bottom of the trench, depositing a layer of spacer material above a gate structure of the device and above the dielectric material above the fin and in the trench, and performing an etching process on the layer of spacer material to define sidewall spacers positioned adjacent the gate structure.

16 Claims, 14 Drawing Sheets

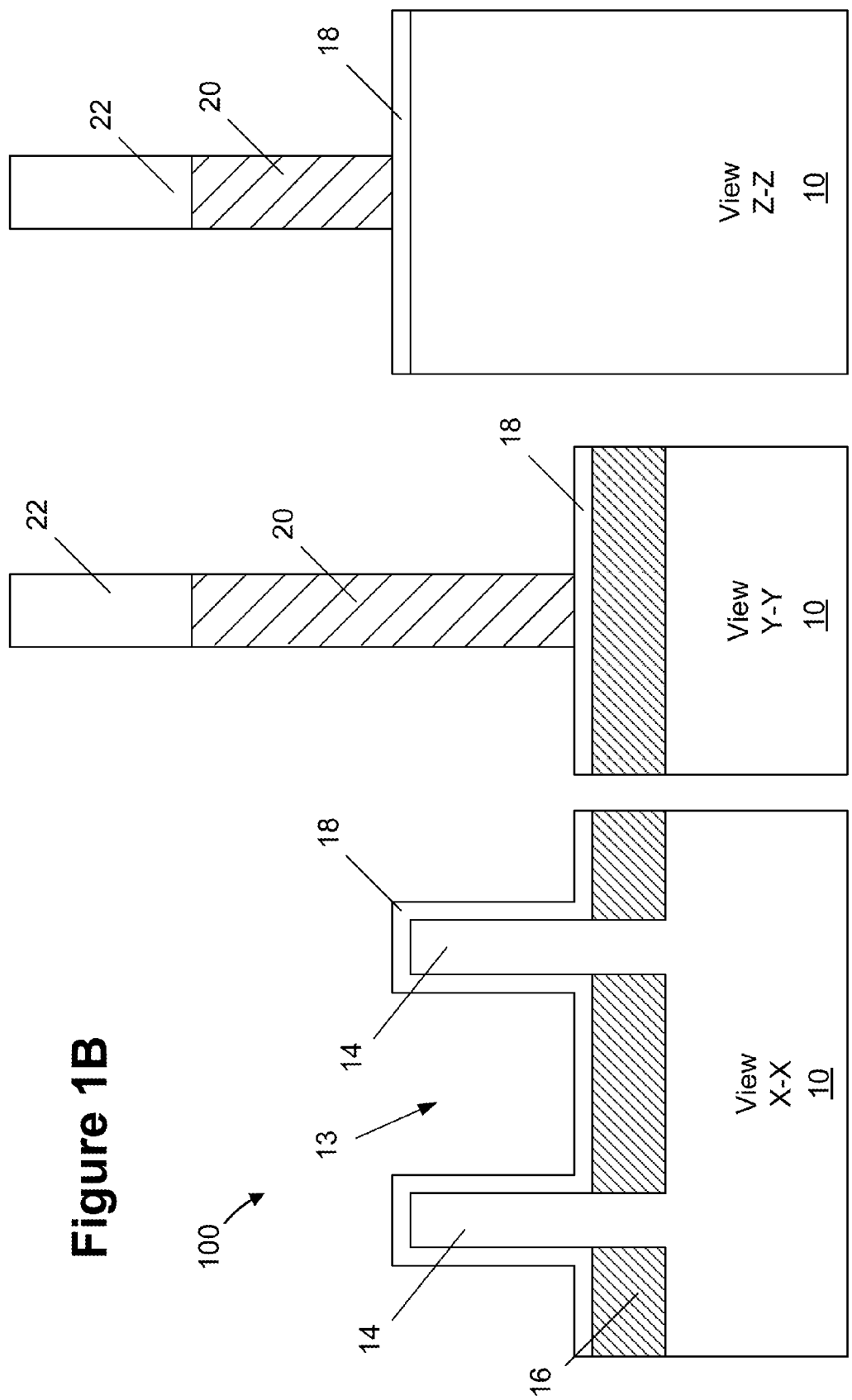

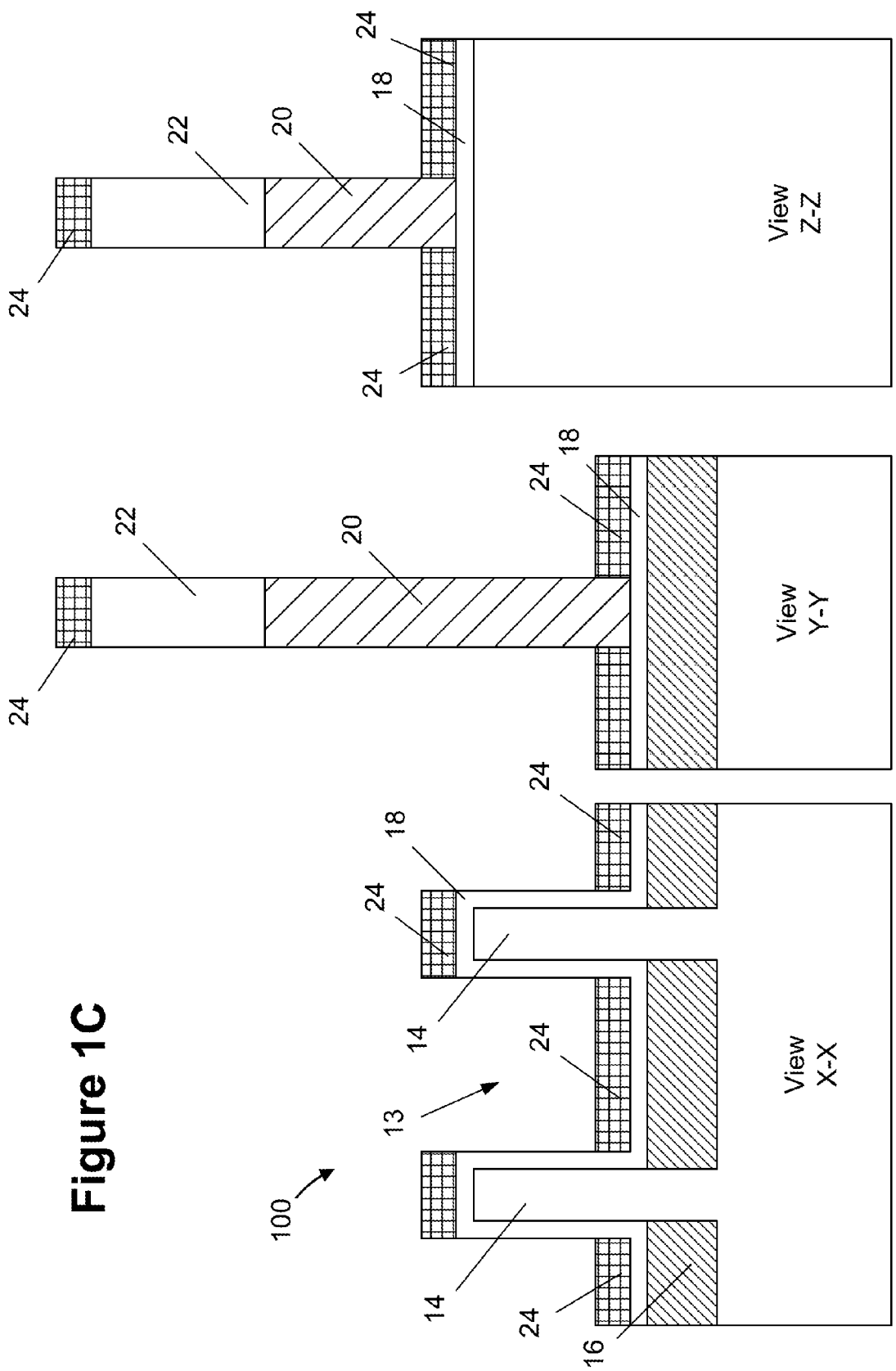

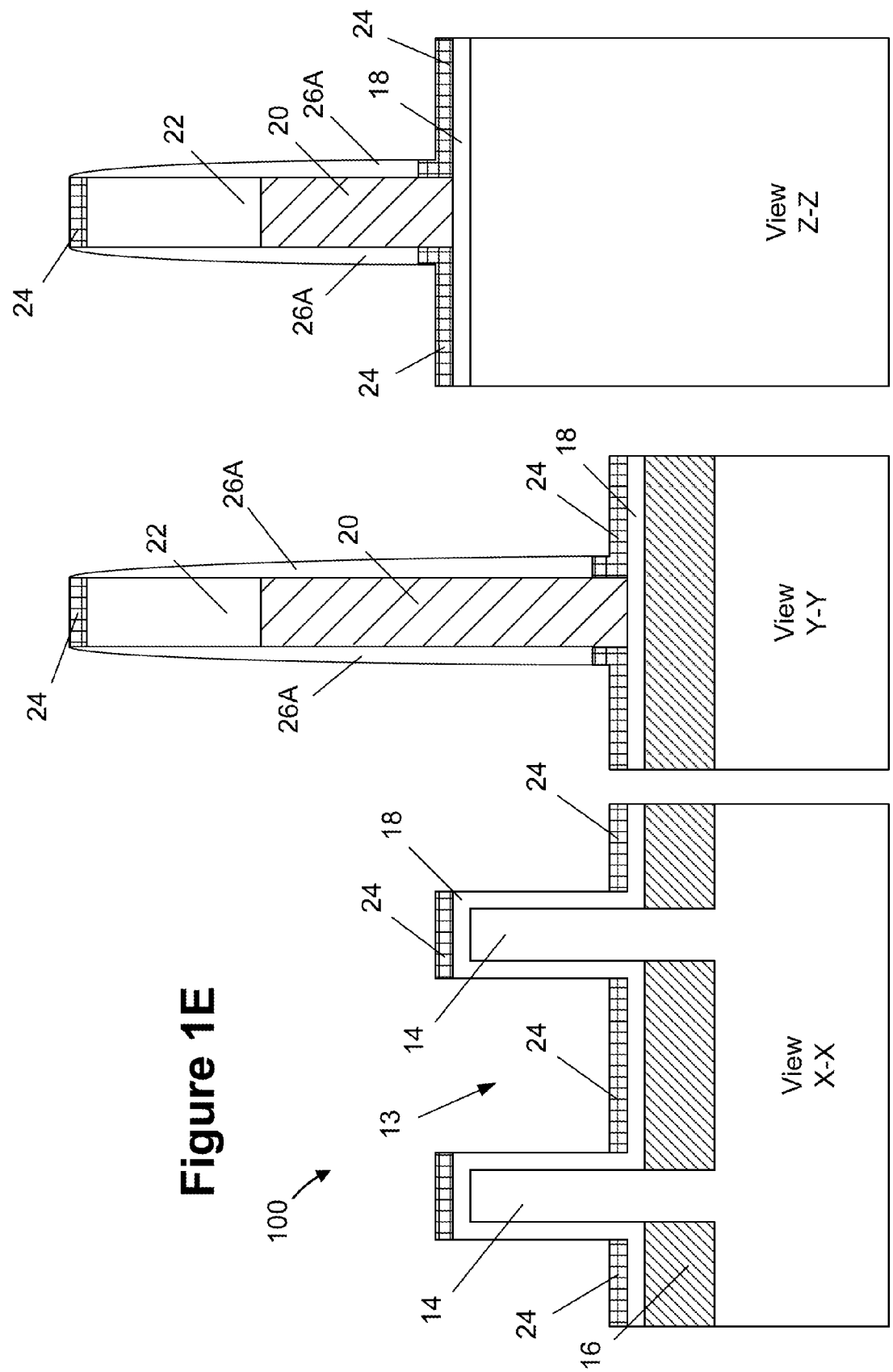

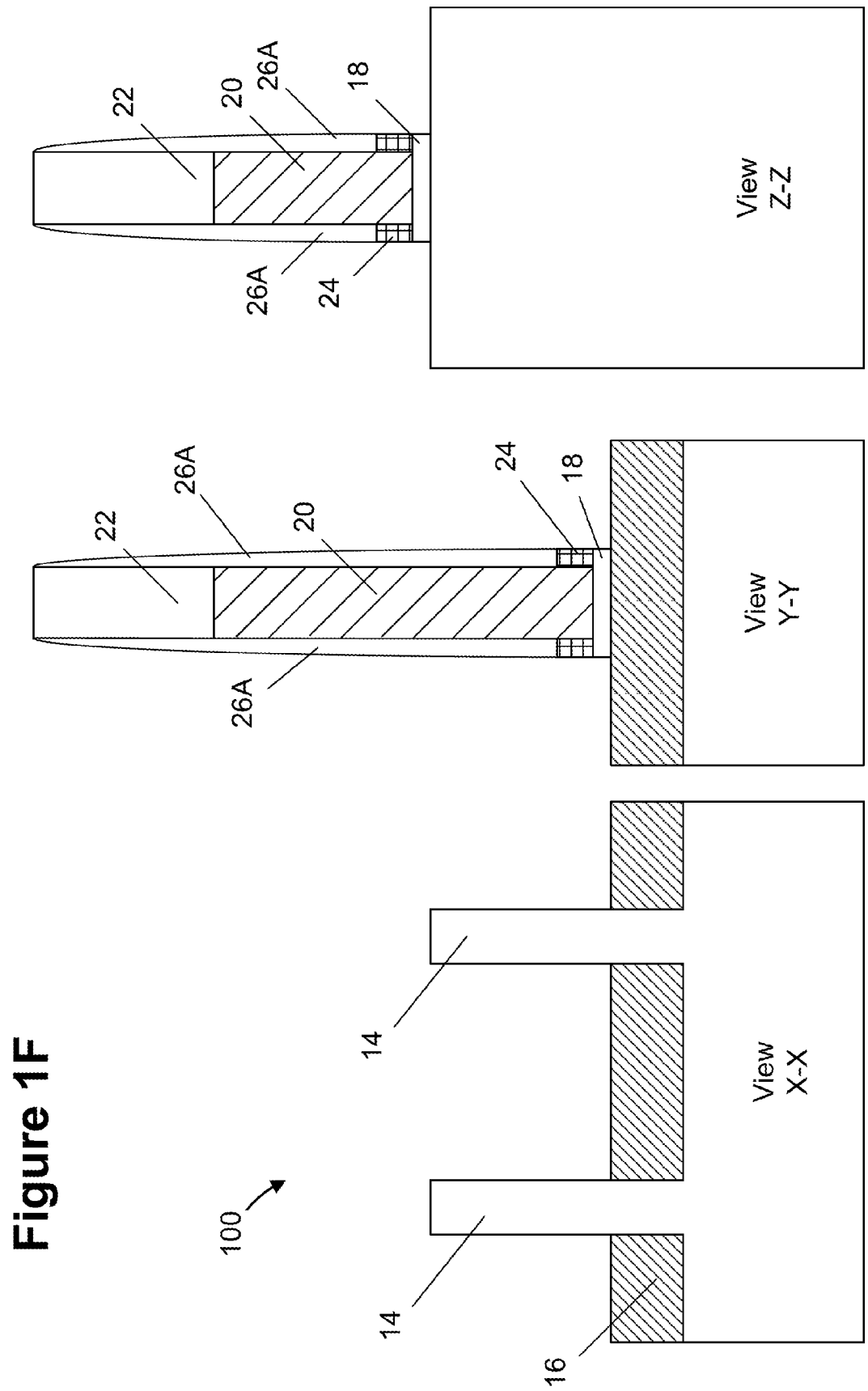

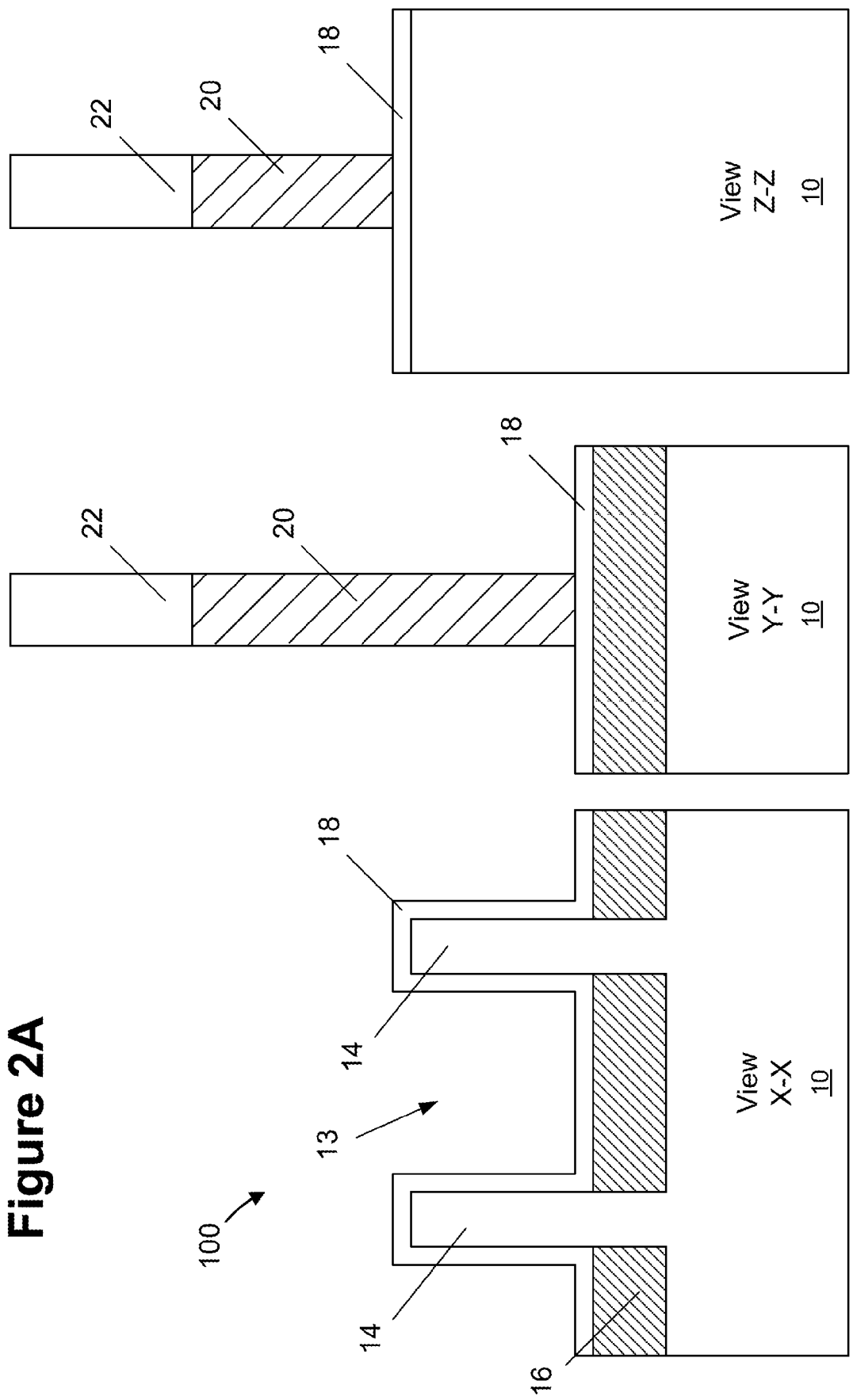

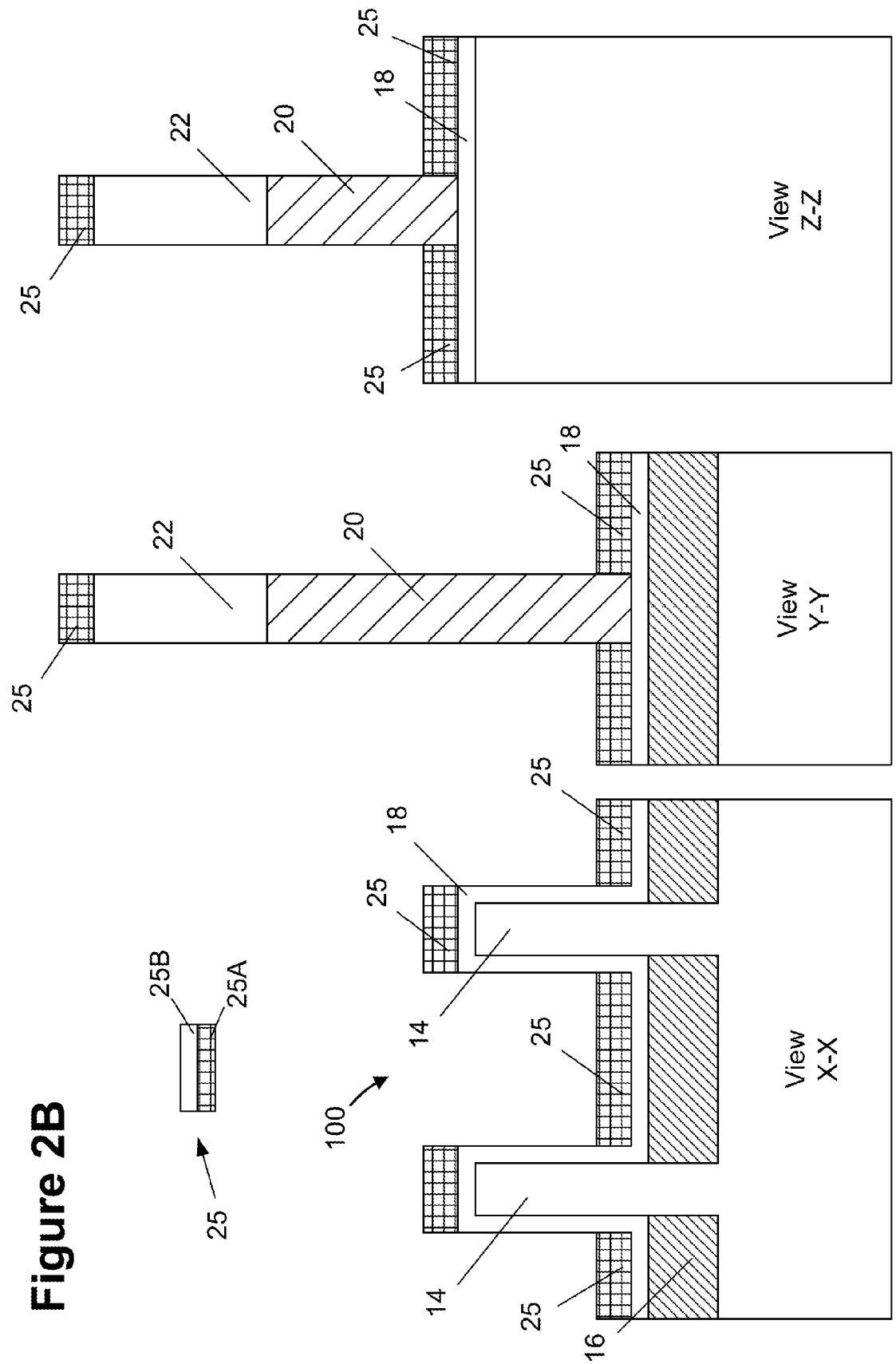

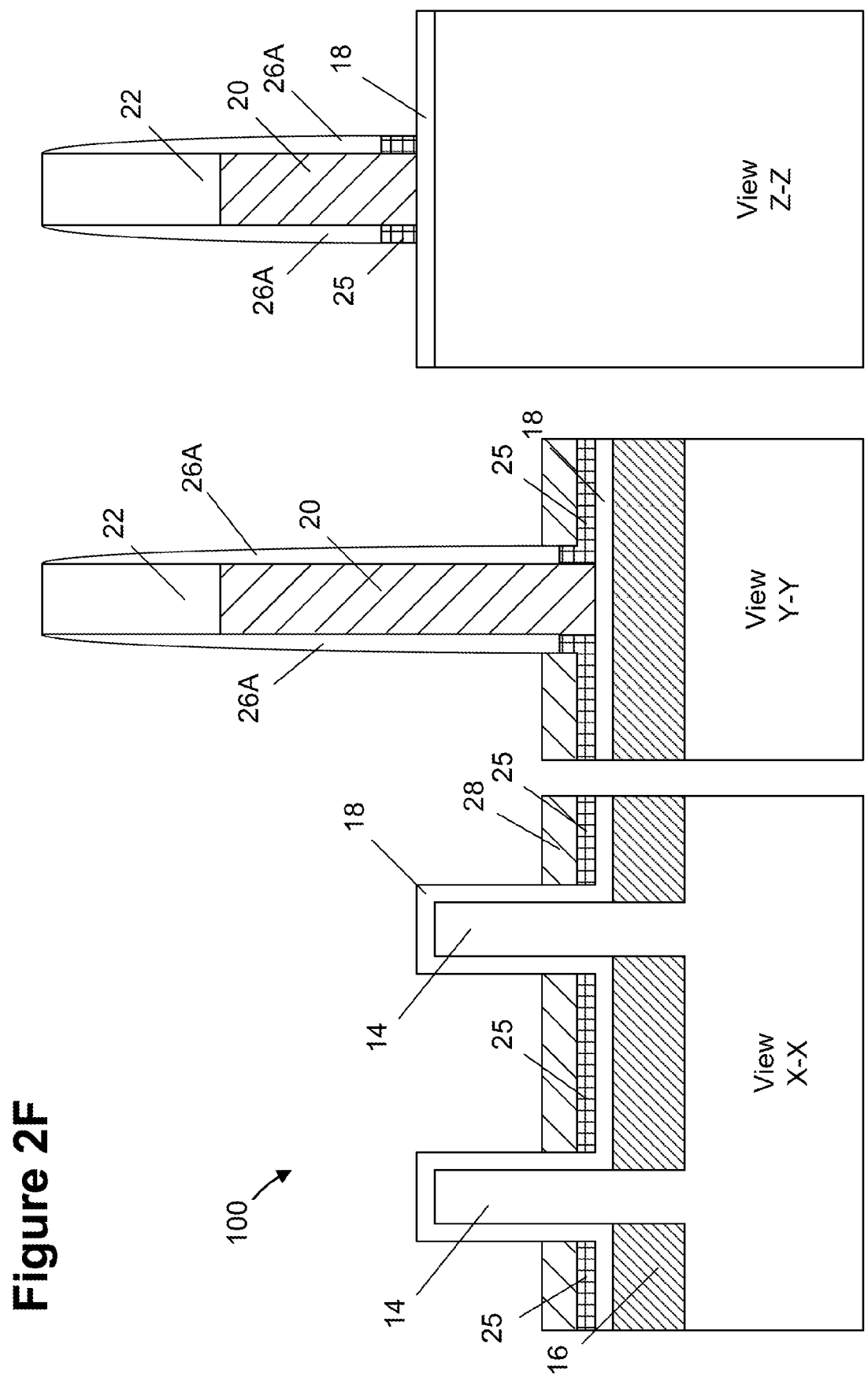

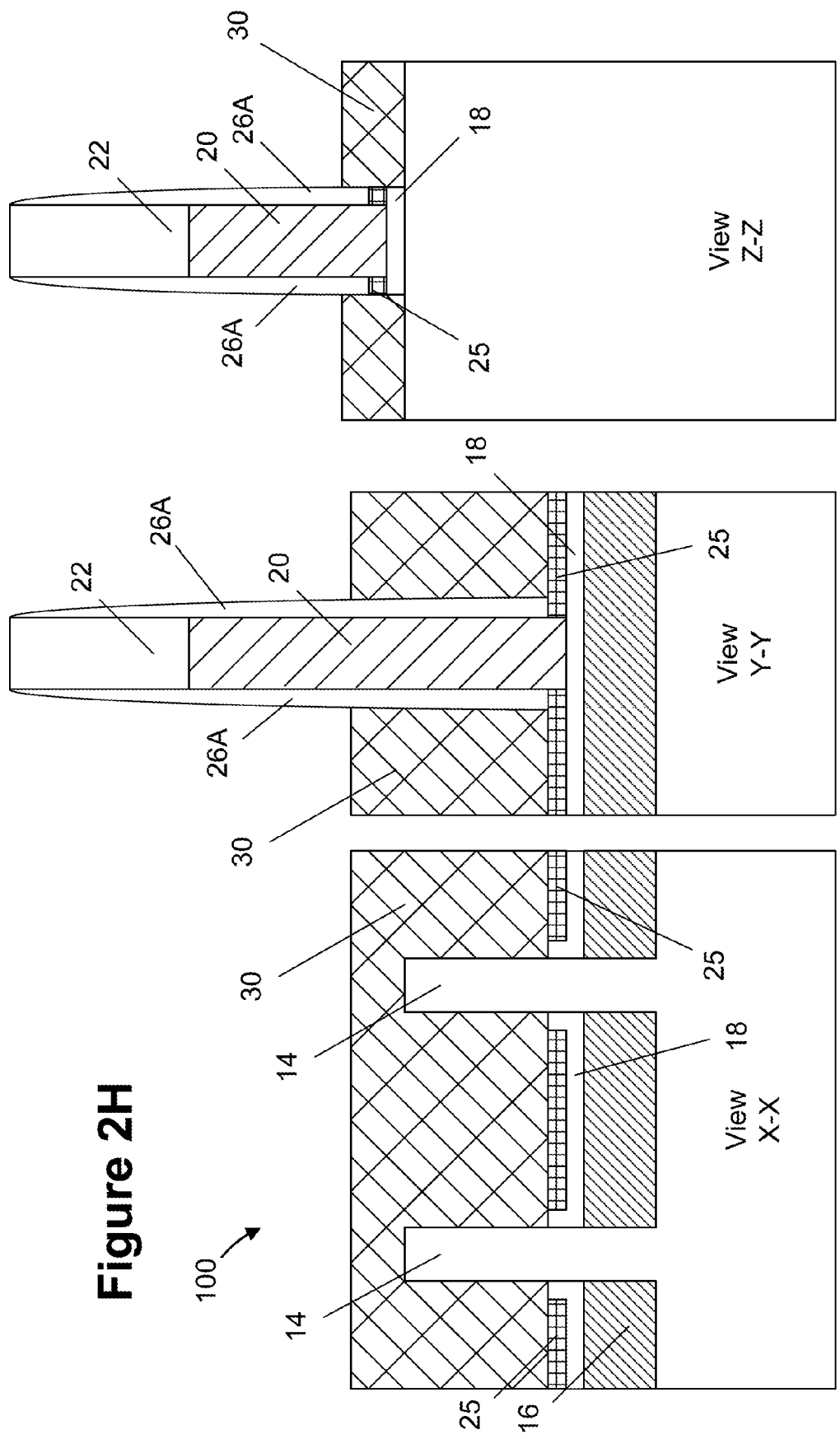

METHODS OF FORMING SPACERS ON FINFETS AND OTHER SEMICONDUCTOR DEVICES

CROSS-REFERENCE TO RELATED APPLICATION

This is a divisional of co-pending application Ser. No. 14/524,076, filed Oct. 27, 2014, which was a divisional of application Ser. No. 13/462,185, filed May 2, 2012, now U.S. Pat. No. 8,900,941, issued Dec. 2, 2014.

BACKGROUND OF THE INVENTION

1. Field of the Invention

Generally, the present disclosure relates to the manufacture of sophisticated semiconductor devices, and, more specifically, to various methods of forming spacers on FinFETs and other semiconductor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a 3-dimensional structure. More specifically, in a FinFET, a generally vertically positioned fin-shaped active area is formed and a gate electrode encloses both sides and an upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

During the formation of FinFET devices, one process operation that is performed is the formation of sidewall spacers adjacent a previously formed gate structure. The sidewall spacers are formed to encapsulate or protect the gate structure. The sidewall spacers are typically comprised of silicon nitride and they are typically formed by conformably depositing a layer of spacer material across the device, including above the fins, and thereafter performing an anisotropic etching process that removes all of the spacer material except on the sidewall of the gate structure. Efforts have been made to protect the fins during this spacer etch process, but as device dimensions shrink, it is becoming more difficult to adequately protect the fins from damage during the spacer etch process.

Another import aspect of FinFET design is accurate and reliable control of the height of the fins in the finished device, which is especially important for bulk FinFET devices. The height of the fins of a FinFET device typically involves the following steps: (1) performing an etching process through a patterned mask layer to define a plurality of trenches in a semiconducting substrate which thereby defines a plurality of fin structures; (2) over-filling the trenches with an insulating material, such as silicon dioxide; (3) performing a chemical mechanical polishing (CMP) process using the hard mask layer as a polish stop to remove excess amounts of the insulating material; and (4) performing an etching process to remove a desired amount of the insulating material from within the trenches until such time as only the desired amount of the insulating material remains positioned in the bottom of the trenches (hereinafter referred to as the "CMP/etch-back" process). The height of the fins is set by the amount of the fin structure that is positioned above the remaining amount of insulating material that is positioned in the bottom of the trenches. However, in subsequent steps during the spacer and epitaxial deposition process that is performed to form source/drain regions, the height of the fins not protected by the gate structure may change due to over-etching or due to the use of HF chemistry.

The present disclosure is directed to various methods and devices that may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming spacers on FinFETs and other semiconductor devices. In one example, the method includes forming a plurality of spaced-apart trenches in a semiconducting substrate that defines a fin, forming a first layer of insulating material in the trenches that covers a lower portion of the fin but exposes an upper portion of the fin, and forming a second layer of insulating material on the exposed upper portion of the fin. The method further comprises selectively forming a dielectric material above an upper surface of the fin and in a bottom of the trench, depositing a layer of spacer material above a gate structure of the device and above the dielectric material above the fin and in the trench, and performing an etching process on the layer of spacer material to define sidewall spacers positioned adjacent the gate structure.

Another illustrative method disclosed herein is directed to establishing fin heights for a FinFET device. In one embodiment, the method includes forming a plurality of spaced-apart trenches in a semiconducting substrate that defines a fin, forming a first layer of insulating material in the trenches that covers a lower portion of the fin but exposes an upper portion of the fin, and forming a second layer of insulating material on the exposed upper portion of the fin. In this embodiment, the illustrative method further comprises selectively forming a dielectric material above an upper surface of the fin and in a bottom of the trench, forming a third layer of insulating material that covers the dielectric material positioned in the trench but leaves the dielectric material positioned above the fin exposed for further processing, performing at least one etching process with the third layer of insulating material in place to remove the dielectric material positioned above the fin and performing at least one etching process to remove the third layer of insulating material and portions of the second layer of insulating material that are at least at a level above an upper surface of the dielectric material positioned in the trench and thereby expose the fin for further processing.

Also disclosed herein are various novel FinFET structures. In one illustrative embodiment, such a device includes a plurality of spaced-apart fins that are at least partially defined by a trench formed in a semiconducting substrate, a first layer of insulating material positioned within the trench between the fins and above a bottom surface of the trench, a second layer of insulating material positioned within the trench between the fins and above the first layer of insulating material, wherein the second layer of insulating material defines a recess, and a third layer of insulating material positioned on the second layer of insulating material within the recess.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative method disclosed herein for forming sidewall spacers on an illustrative FinFET device; and FIGS. 2A-2H depict another illustrative method disclosed herein for controlling fin height on a FinFET device.

Figure 1A:
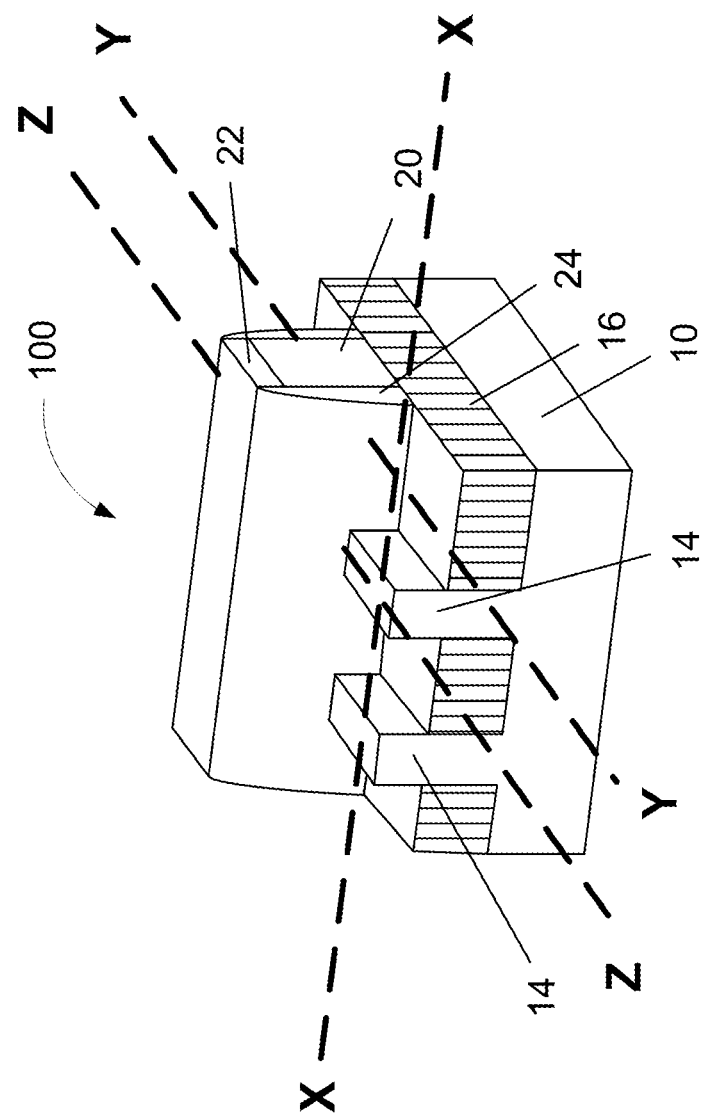

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming spacers on FinFETs and other semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. The illustrative device 100 includes a plurality of fins 14, a local isolation layer 16, a gate electrode 20, sidewall spacers 24 and a gate cap layer 22. FIG. 1A depicts the locations where various cross-sectional views of the device 100 will be taken in the drawings discussed below. More specifically, view "X-X" is a cross-sectional view taken through the fins 14 in a direction that is transverse to the long axis of the fins 14, view "Y-Y" is a cross-sectional view taken between the fins 14 in a direction that is parallel to the long axis of the fins 14; and view "Z-Z" is a cross-sectional view taken along the long axis of the fins 14. It should be understood that FIG. 1A is only provided to show the location of the various cross-sectional views depicted in the drawings below, and many aspects discussed below are not depicted in FIG. 1A so as to not overly complicate the device 100 depicted in FIG. 1A.

At the point of fabrication depicted in FIG. 1B, various process operations have been performed to define various structures for the device 100. More specifically, a plurality of fins 14 have been defined in the substrate 10 using a variety of known techniques, and a schematically depicted gate electrode 20 has been formed above the device 100.

With continuing reference to FIG. 1A, in one illustrative process flow, an etching process, such as a dry or wet etching process, is performed on the substrate 10 through a patterned mask layer (not shown) to form a plurality of trenches 13. This etching process results in the definition of a plurality of fins 14. The overall size, shape and configuration of the trenches 13 and fins 14 may vary depending on the particular application. The depth and width of the trenches 14 may vary depending upon the particular application. In one illustrative embodiment, based on current day technology, the depth of the trenches 13 may range from approximately 30-150 nm and the width of the trenches 13 may range from about 20-50 nm. In some embodiments, the fins 14 may have a width within the range of about 5-30 nm. In the illustrative example depicted in the attached drawings, the trenches 13 and fins 14 are all of a uniform size and shape. However, as discussed more fully below, such uniformity in the size and shape of the trenches 13 and the fins 14 is not required to practice at least some aspects of the inventions disclosed herein. In the example depicted herein, the trenches 13 are formed by performing an anisotropic etching process that results in the trenches 13 having a schematically depicted, generally rectangular configuration. In an actual real-world device, the sidewalls of the trenches 13 may be somewhat inwardly tapered, although that configuration is not depicted in the drawings. In some cases, the trenches 13 may have a reentrant profile near the bottom of the trenches 13. To the extent the trenches 13 are formed by performing a wet etching process, the trenches 13 may tend to have a more rounded configuration or non-linear configuration as compared to the generally rectangular configuration of the trenches 13 that are formed by performing an anisotropic etching process. Thus, the size and configuration of the trenches 13, and the manner in which they are made, should not be considered a limitation of the present invention. For ease of disclosure, only the substantially rectangular trenches 13 will be depicted in subsequent drawings.

The next operation involves forming a layer of insulating material 16, a so-called local isolation layer, in the trenches 13 of the device 100. The layer of insulating material 16 may be comprised of a variety of different materials, such as silicon dioxide, etc., and it may be formed by performing a variety of techniques, e.g., chemical vapor deposition (CVD), etc. In one illustrative embodiment, the layer of insulating material 16 may be a layer of silicon dioxide material that is formed by performing a CVD process such that it overfills the trenches 13. A chemical mechanical polishing (CMP) process may then be performed to planarize the surface of the layer of insulating material 16 using the patterned hard mask layer (not shown) as a polish stop layer. Then, an etching process may be performed to recess the layer of insulating material 16 such that it has a final desired thickness and so that it covers a lower portion of the fins 14 while exposing an upper portion of the fins 14.

After the local isolation layer 16 is formed, the patterned hard mask layer used to etch the substrate 10 to define the fins 14 may be removed. Thereafter, a layer of insulating material 18 may be conformably deposited above the device 100. In one illustrative embodiment, the layer of insulating material 18 may be a sacrificial gate insulation layer or it may be a final gate insulation layer for the completed device 100. The layer of insulating material 18 may be comprised of a variety of different materials, such as, for example, silicon dioxide, a so-called high-k (k greater than 5) insulation material (where k is the relative dielectric constant), etc.

With continuing reference to FIG. 1B, at the point of fabrication depicted therein, a plurality of gate electrodes 20, each with a corresponding gate cap layer 22, have been formed above the device 100. The gate electrode 20 may be sacrificial in nature or it may be the final gate electrode for the finished device. The gate electrode 20 may be comprised of a variety of different materials, such as polysilicon or amorphous silicon, or it may be comprised of one or more metal layers that act as the gate electrode. As will be recognized by those skilled in the art after a complete reading of the present application, the gate structure of the device 100 depicted in the drawings is intended to be representative in nature. That is, the gate structure may be comprised of a variety of different materials and it may have a variety of configurations, and the gate structure may be made using either so-called "gate-first" or "gate-last" techniques. In one illustrative embodiment, an ALD process may be performed to form the layer of insulating material 18 that is comprised of silicon dioxide having a thickness that falls within the range of about 2-10 nm. Thereafter, the gate electrode material, e.g., polysilicon, and a gate cap layer of material, e.g., silicon nitride, may be deposited above the device 100 and those layers may be patterned using known photolithographic and etching techniques.

Next, as shown in FIG. 1C, a gas cluster ion beam (GCIB) process is performed to form dielectric material regions 24 in the trenches 13 and above the fins 14 and above the gate cap layers 22. Among other things, the dielectric material regions 24 will serve to better protect the fins 14 during the subsequent etching process that will be performed to form sidewall spacers for the gate structure of the device 100. The GCIB process may be performed with (a masked process) or without (a blanket process) a masking layer, e.g., a photoresist mask or a hard mask; however, so as not to obscure the present invention, such a masking layer is not depicted in the drawings. In general, the GCIB process results in the formation of material 24 on the substantially horizontally oriented surfaces, such as above the fins 14, without forming appreciable amounts of the material 24 on vertically oriented surfaces. The regions 24 may be comprised of a variety of different materials, e.g., silicon nitride, silicon dioxide, and the thickness of the material regions 24 may vary depending upon the particular application. In one illustrative embodiment, the dielectric material regions 24 may be silicon dioxide or silicon carbide and the regions may have a thickness that falls within the range of about 2-10 nm.

Figure 1D:
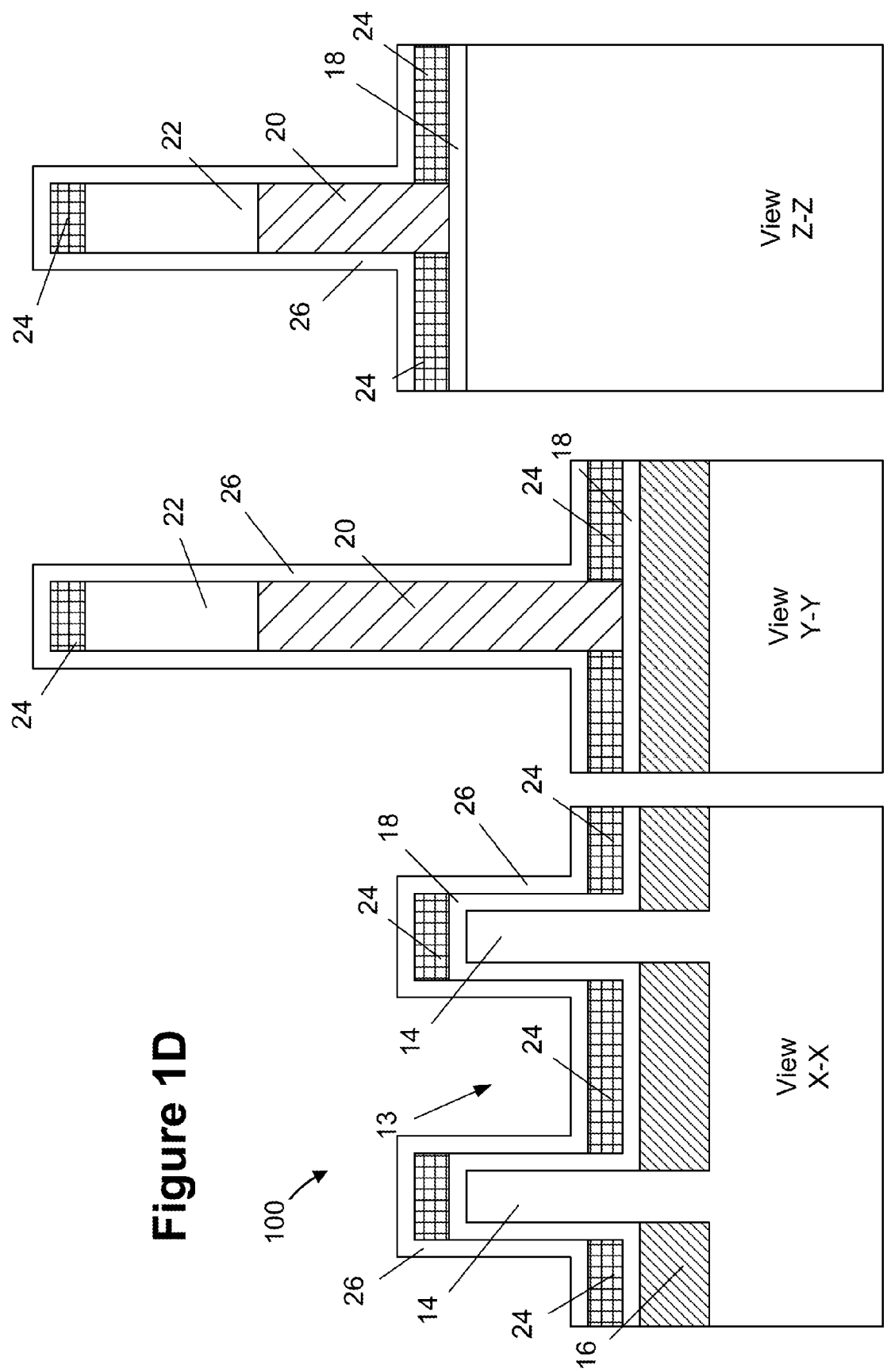

Next, as shown in FIGS. 1D and 1E, a layer of spacer material 26 is formed above the device 100 and then etched to thereby form sidewall spacers 26A (see FIG. 1E). The spacers 26A may be comprised of a variety of different materials, such as silicon nitride. The spacers 26A may be formed by depositing a layer of spacer material and thereafter performing an anisotropic etching process. The spacers 26A may have a base thickness of about 5-10 nm. Within the trenches 13, the sidewall spacers do not form to any appreciable extent due to the relatively short height of the fins 14 and the duration of the etching process. It should also be noted that, during the spacer etch process, some portion of the thickness of the dielectric material regions 24 may be consumed. This reduction in thickness is depicted in FIG. 1E. However, the original dielectric material regions 24 were formed to a sufficient thickness such that they protect the fins 14 during the sidewall spacer etch process.

Next, an etching process, such as a dry or wet etching process, is performed to remove the dielectric material regions 24, and the layer of insulating material 18, thereby leaving the local isolation layer 16 in the trenches 13. In one illustrative example, the dielectric material regions 24 and the layer of insulating material 18 are both made of silicon dioxide and they may be removed in a common etching process. The etching process may be controlled or timed so as to insure that the local isolation layer 16 remains intact. At the point of processing depicted in FIG. 1F, the device 100 may be completed using traditional techniques, e.g., if applicable, removing a sacrificial gate structure and replacing it with a final or replacement gate structure, the formation of epitaxially deposited layers of material in the source/drain region of the device 100, the formation of various conductive contact structures to various regions of the device, etc.

Figure 2C:
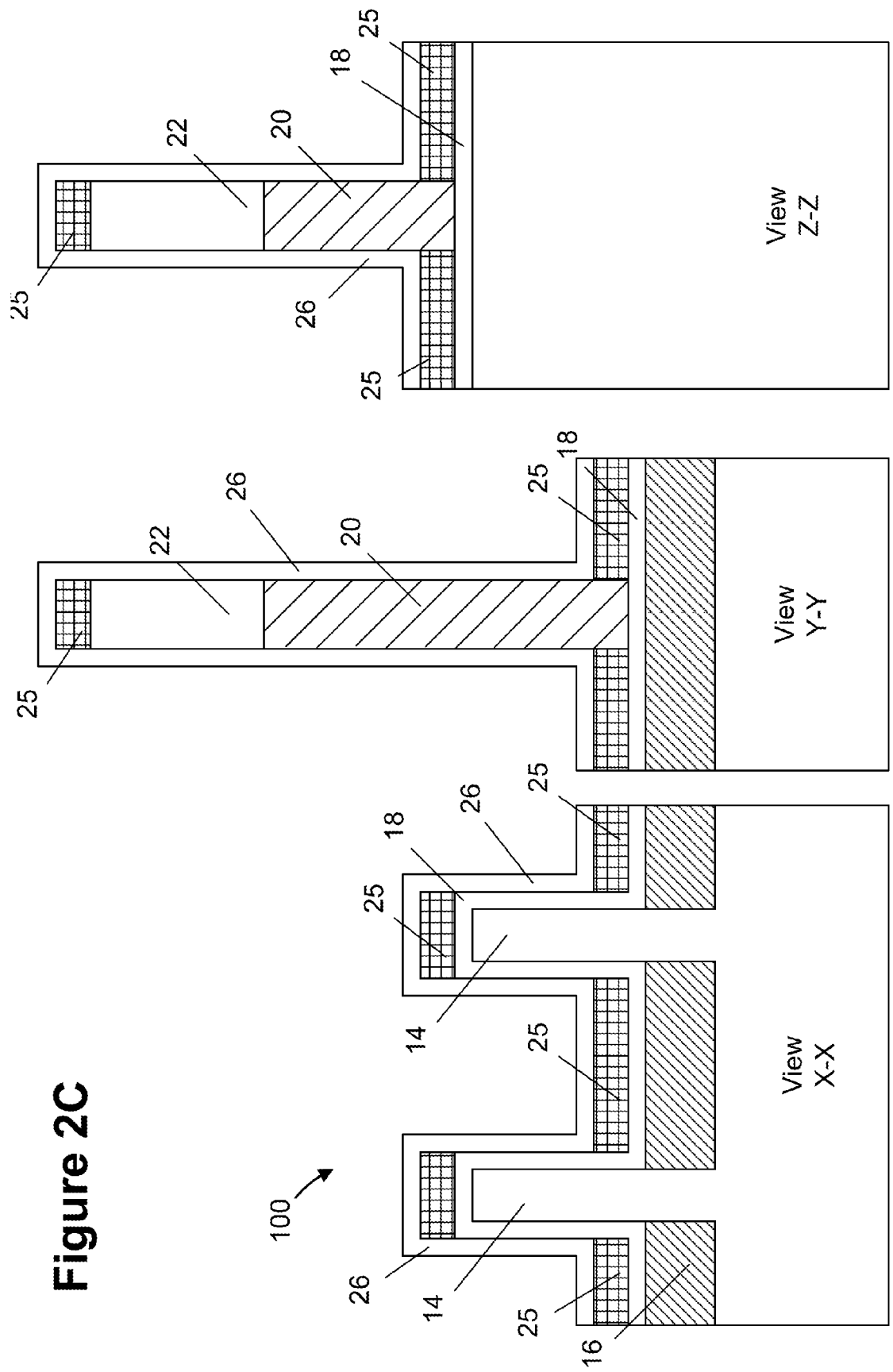

FIGS. 2A-2H depict another illustrative method disclosed herein. FIG. 2A depicts the device 100 at a point in fabrication that corresponds to that described above with reference to FIG. 1A. Thus, the discussion above regarding FIG. 1A and the structures depicted therein applies equally to this illustrative embodiment.

As shown in FIG. 2B, one or more GCIB process(es) is performed to form dielectric material regions 25 in the trenches 13 and above the fins 14 and above the gate cap layers 22. The dielectric material regions 25 may have either a single layer or bi-layer construction, such as the illustrative bi-layer construction (layers 25A, 25B) depicted in the upper left portion of FIG. 2B. In one illustrative embodiment, the overall thickness of the dielectric material region 25 (either single or dual layer construction) may fall within the range of about 2-10 nm. In one illustrative embodiment, the single layer dielectric material region 25 may be comprised of the same material as will be used for the sidewall spacers 26A, e.g., silicon nitride. In another illustrative embodiment, where the dielectric material region 25 has a bi-layer construction, the bottom layer 25A may be silicon nitride, while the top layer 25B may be, for example, made of silicon dioxide. The GCIB process(es) may be performed with (a masked process) or without (a blanket process) a masking layer, e.g., a photoresist mask or a hard mask; however, so as not to obscure the present invention, such a masking layer is not depicted in the drawings.

Figure 2D:
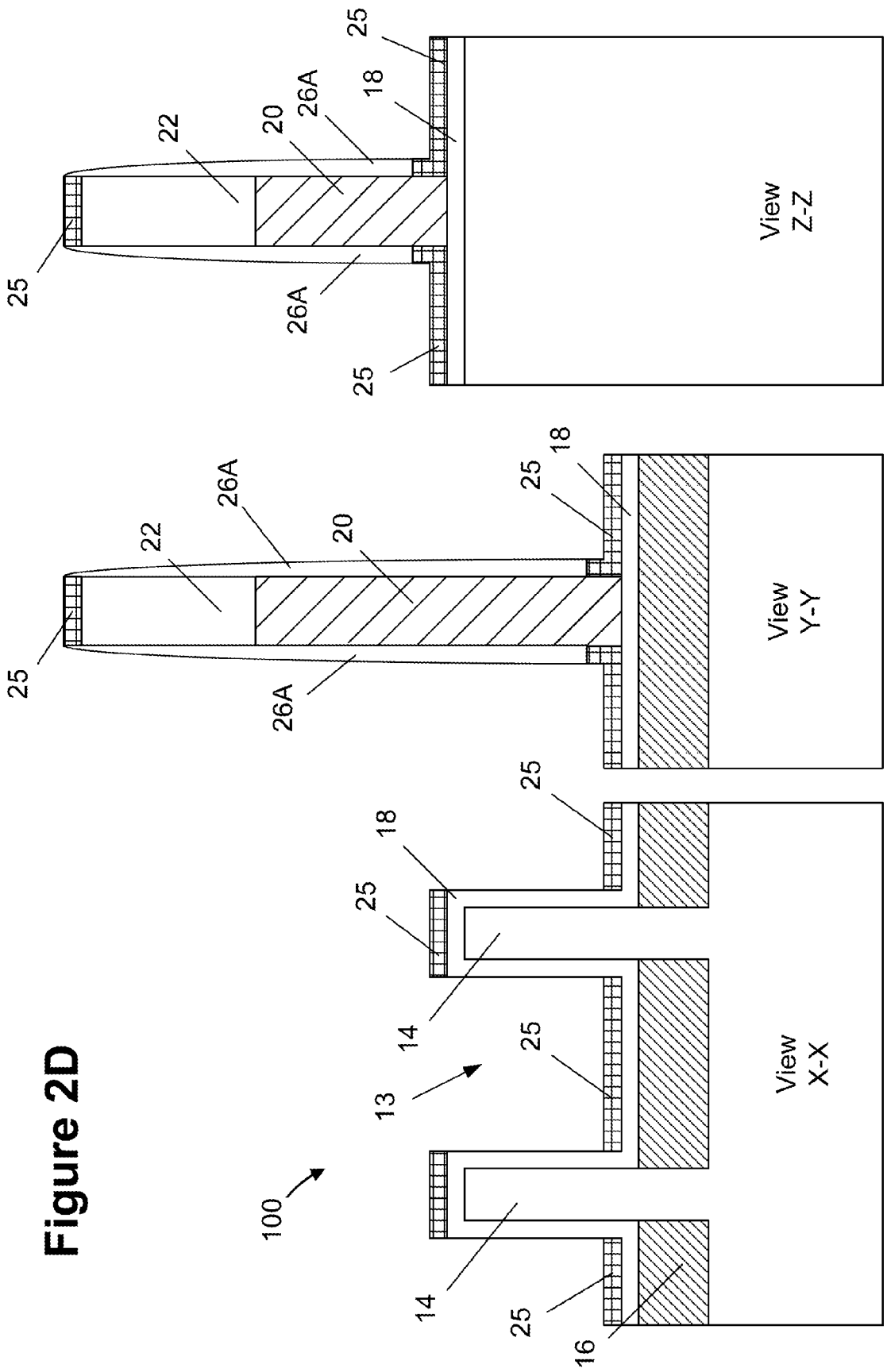

Next, as shown in FIGS. 2C and 2D, the layer of spacer material 26 is formed above the device 100 and then etched to thereby form sidewall spacers 26A (see FIG. 2D). As before, the spacers 26A may be comprised of a variety of different materials, such as silicon nitride, and they may be formed by depositing a layer of spacer material and thereafter performing an anisotropic etching process. As noted previously, within the trenches 13, the sidewall spacers do not form to any appreciable extent due to the relatively short height of the fins 14 and the duration of the etching process. It should also be noted that, during the spacer etch process, some portion of the thickness of the dielectric material regions 25 may be consumed. This reduction in thickness is depicted in FIG. 2D.

Figure 2E:
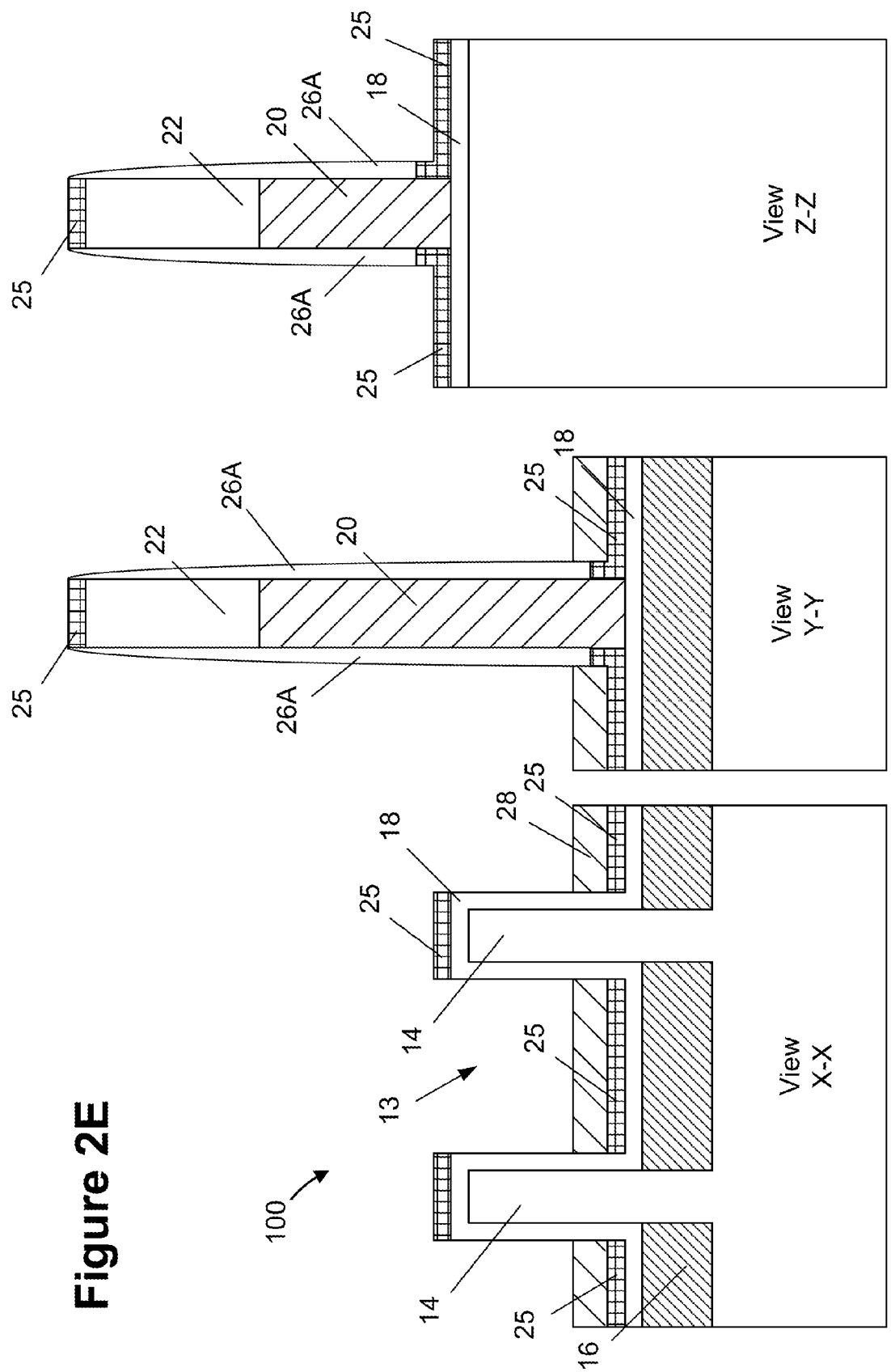

Next, several process operations are performed to insure complete removal of silicon nitride material from above the fins 14. In one embodiment, as shown in FIG. 2E, the process begins with the formation of a flowable oxide material layer 28 in the bottom of the trenches 13 above the residual portions of the dielectric material 25. The flowable oxide material layer 28 may be deposited to the desired thickness by using a relatively new Novellus flowable oxide process, wherein at least some aspects of the aforementioned Novellus process are believed to be disclosed in U.S. Pat. No. 7,915,139, which is hereby incorporated by reference in its entirety. In general, the Novellus process is a relatively low-temperature process whereby the precursor material used in the process flows to the lowest level in the structure—in this case the bottom of the trenches 13. The parameters of the deposition process, such as the length of the deposition process, determine the final thickness of the flowable oxide material layer 28.

Next, as shown in FIG. 2F, an etching process is performed to remove dielectric material 25 from above the fins 14 and from above the gate electrode 20. As shown in the "Z-Z" view of FIG. 2F, this etching process also removes the portions of the dielectric material 25 that are not protected by the spacers 26A. The etching process may be either a wet or dry etching process. The parameters of the etching process are controlled such that there is only minimal consumption of the cap layer 22 and the spacers 26A. Note that, during this etching process, the layer of insulating material 18 provides protection for the fins 14.

Figure 2G:
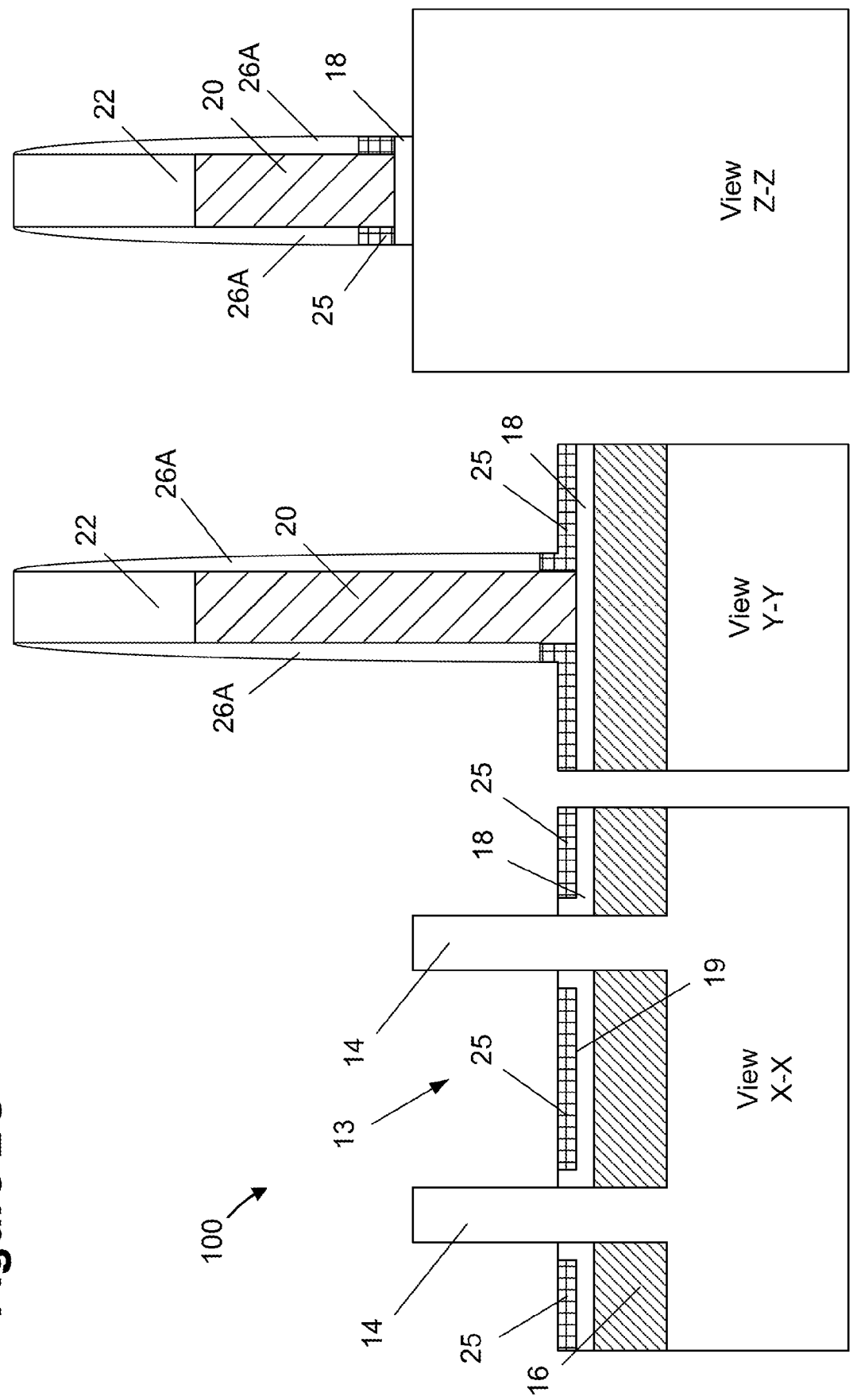

As shown in FIG. 2G, an etching process, such as a wet etching process, is performed to remove all of the exposed silicon dioxide material. More specifically, the etching process removes the exposed portions of the layer of insulating material 18 and the flowable oxide material layer 28. As shown in the "Z-Z" view of FIG. 2G, this etching process also removes the portions of the layer of insulating material 18 that are not protected by the spacers 26A. At the end of this etching process, residual portions of the dielectric material 25 are positioned in the bottom of the trenches 13. That is, the remaining portion of the layer of insulating material 18 defines a recess 19 in which the dielectric material 25 is positioned. The dielectric material 25 in the bottom of the trenches 13 essentially defines the final fin height of the device 100. Since the dielectric material 25 was formed by a highly-controllable deposition process, the thickness of the dielectric material 25 can be accurately controlled when it is initially formed. This provides much better accuracy in terms of setting the final fin height for the device as compared to other prior art techniques for establishing fin height and consequently permits better control of the height of the epitaxial material.

At the point of processing depicted in FIG. 2G, the device 100 may be completed using traditional techniques. For example, as shown in FIG. 2H, one or more epitaxial growth processes may be performed to form epitaxial material 30 in and above the trenches 13 and on the fins 14. The epitaxial material may be doped or undoped and it may be formed so as to have a desired stress, e.g., a compressive stress for a P-type FinFET device 100 or a tensile stress for an N-type FinFET device. Additional operations may also be performed on the device 100 to complete its fabrication, e.g., if applicable, removing a sacrificial gate structure and replacing it with a final or replacement gate structure, the formation of various conductive contact structures to various regions of the device, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A FinFET device, comprising:
a plurality of spaced-apart fins that are at least partially defined by a trench formed in a semiconducting substrate;
a first layer of insulating material positioned within said trench between said fins and above a bottom surface of said trench;
a second layer of insulating material positioned within said trench between said fins and above said first layer of insulating material; and
a third layer of insulating material positioned above said second layer of insulating material, wherein portions of said second layer of insulating material are positioned between said third layer of insulating material and each of said fins.

2. The device of claim 1, wherein said first and second layers of insulating material are comprised of silicon dioxide and said third layer of insulating material is comprised of silicon nitride.

3. The device of claim 1, wherein an upper surface of said third layer of insulating material defines a height of said fins.

4. The device of claim 1, wherein said second layer of insulating material defines a recess and wherein said third layer of insulating material is positioned within said recess.

5. The device of claim 1, further comprising a semiconductor material positioned at least partially between the fins, the semiconductor material having a bottom surface that is positioned on and in contact with said second and third layers of insulating material.

6. The device of claim 1, wherein said second layer of insulating material is positioned on and in contact with said first layer of insulating material and said third layer of insulating material is positioned on and in contact with said second layer of insulating material.

7. The device of claim 1, further comprising a gate structure positioned above said semiconducting substrate and extending continuously across each of said plurality of spaced-apart fins, said gate structure surrounding and continuously covering opposing sidewalls and an upper surface of a portion of each of said plurality of spaced-apart fins.

8. A FinFET device, comprising:
a plurality of spaced-apart fins that are at least partially defined by a trench formed in a semiconducting substrate;
a first layer of insulating material positioned within said trench between said fins and above a bottom surface of said trench;
a second layer of insulating material positioned within said trench between said fins and above said first layer of insulating material, said second layer of insulating material defining a recess; and
a third layer of insulating material positioned on said second layer of insulating material within said recess.

9. The device of claim 8, wherein said first and second layers of insulating material are comprised of silicon dioxide and said third layer of insulating material is comprised of silicon nitride.

10. The device of claim 8, wherein an upper surface of said third layer of insulating material defines a height of said fins.

11. The device of claim 8, further comprising a semiconductor material positioned at least partially between the fins, the semiconductor material having a bottom surface that is positioned on and in contact with said second and third layers of insulating material.

12. The device of claim 8, further comprising a gate structure positioned above said semiconducting substrate and extending continuously across each of said plurality of spaced-apart fins, said gate structure surrounding and continuously covering opposing sidewalls and an upper surface of a portion of each of said plurality of spaced-apart fins.

13. A FinFET device, comprising:
a plurality of spaced-apart fins that are at least partially defined by a trench formed in a semiconducting substrate;
a first layer of insulating material positioned within said trench between said fins and above a bottom surface of said trench;
a second layer of insulating material positioned within said trench between said fins and on and in contact with said first layer of insulating material, said second layer of insulating material defining a recess;
a third layer of insulating material positioned on and in contact with said second layer of insulating material within said recess; and
a semiconductor material positioned at least partially between the fins, the semiconductor material having a bottom surface that is positioned on and in contact with said second and third layers of insulating material.

14. The device of claim 13, wherein said first and second layers of insulating material are comprised of silicon dioxide and said third layer of insulating material is comprised of silicon nitride.

15. The device of claim 13, wherein an upper surface of said third layer of insulating material defines a height of said fins.

16. The device of claim 13, further comprising a gate structure positioned above said semiconducting substrate and extending continuously across each of said plurality of spaced-apart fins, said gate structure surrounding and continuously covering opposing sidewalls and an upper surface of a portion of each of said plurality of spaced-apart fins.

* * * * *